US009500938B2

(12) United States Patent
Wiener et al.

(10) Patent No.: US 9,500,938 B2
(45) Date of Patent: Nov. 22, 2016

(54) RADIATION-EMITTING COMPONENT

(71) Applicant: OSRAM Opto Semiconductors GmbH, Regensburg (DE)

(72) Inventors: Daniel Wiener, Obertraubling (DE); Konrad Wagner, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 22 days.

(21) Appl. No.: 14/436,071

(22) PCT Filed: Oct. 11, 2013

(86) PCT No.: PCT/EP2013/071318
§ 371 (c)(1),
(2) Date: Apr. 15, 2015

(87) PCT Pub. No.: WO2014/060318
PCT Pub. Date: Apr. 24, 2014

(65) Prior Publication Data
US 2015/0268543 A1     Sep. 24, 2015

(30) Foreign Application Priority Data
Oct. 15, 2012   (DE) .................. 10 2012 109 806

(51) Int. Cl.
*G03B 21/20*     (2006.01)
*F21V 9/08*      (2006.01)
(Continued)

(52) U.S. Cl.
CPC ............... *G03B 21/204* (2013.01); *F21K 9/56* (2013.01); *F21V 9/08* (2013.01); *G02B 19/0028* (2013.01);
(Continued)

(58) Field of Classification Search
CPC  G03B 21/204; G03B 21/2033; G03B 27/20; F21V 9/16; F21V 9/08; F21V 9/56; F21K 9/56
See application file for complete search history.

(56) References Cited

U.S. PATENT DOCUMENTS 8,096,668 B2 *   1/2012   Abu-Ageel .......... G02B 3/0006
                                              362/296.01
8,931,922 B2 *   1/2015   Zink ..................... H01L 33/505
                                              362/293
(Continued)

FOREIGN PATENT DOCUMENTS

DE    102006045702 A1   4/2008
DE    102009027977 A1   1/2011
(Continued)

*Primary Examiner* — William C Dowling
(74) *Attorney, Agent, or Firm* — Slater Matsil, LLP

(57) ABSTRACT

A radiation-emitting component is disclosed. In embodiments a component includes a radiation-emitting semiconductor chip having a radiation exit area including a side face and a main face, a conversion element having a radiation exit area including a side face and a main face, and a first reflection element disposed downstream of the conversion element and the radiation-emitting semiconductor chip, wherein a ratio of a sum of the radiation exit areas of the radiation-emitting semiconductor chip to a sum of the radiation exit areas of the conversion element is greater than 1, wherein the conversion element adjoins the radiation-emitting semiconductor chip, wherein the radiation-emitting semiconductor chip is configured to generate primary radiation, wherein the conversion element is configured to convert the primary radiation into secondary radiation, and wherein the primary radiation and the secondary radiation leave the radiation-emitting component exclusively through the first reflection element.

11 Claims, 2 Drawing Sheets

(51) Int. Cl.
*F21K 99/00* (2016.01)
*H01L 33/46* (2010.01)
*G02B 19/00* (2006.01)
*H01L 25/075* (2006.01)
*H01L 33/50* (2010.01)
*F21Y 101/02* (2006.01)

(52) U.S. Cl.
CPC ........... *G02B 19/0061* (2013.01); *H01L 33/46* (2013.01); *F21Y 2101/02* (2013.01); *H01L 25/0753* (2013.01); *H01L 33/50* (2013.01); *H01L 2924/0002* (2013.01)

(56) References Cited

U.S. PATENT DOCUMENTS

| | | |
|---|---|---|
| 2008/0203419 A1 | 8/2008 | Harada |
| 2009/0261366 A1 | 10/2009 | Eisert et al. |
| 2010/0202129 A1* | 8/2010 | Abu-Ageel ........ C09K 11/7734 362/84 |
| 2013/0320369 A1 | 12/2013 | Gärtner et al. |
| 2014/0043788 A1* | 2/2014 | Gielen .................... F21K 9/135 362/84 |
| 2014/0328049 A1* | 11/2014 | Hikmet ..................... F21K 9/54 362/84 |
| 2015/0077989 A1* | 3/2015 | Hikmet ..................... F21V 9/16 362/235 |
| 2015/0117013 A1* | 4/2015 | Hikmet .................. H01J 61/44 362/293 |
| 2015/0167906 A1* | 6/2015 | Tomiyama ........... G03B 21/204 353/31 |
| 2016/0025294 A1* | 1/2016 | Dijken ..................... F21K 9/54 362/84 |

FOREIGN PATENT DOCUMENTS

| | | |
|---|---|---|
| JP | 2007088348 A | 4/2007 |
| WO | 2007036214 A1 | 4/2007 |
| WO | 2009107038 A1 | 9/2009 |
| WO | 2011088363 A2 | 7/2011 |
| WO | 2012056378 A1 | 5/2012 |
| WO | 2012084451 A1 | 6/2012 |

* cited by examiner

RADIATION-EMITTING COMPONENT

This patent application is a national phase filing under section 371 of PCT/EP2013/071318, filed Oct. 11, 2013, which claims the priority of German patent application 10 2012 109 806.9, filed Oct. 15, 2012, each of which is incorporated herein by reference in its entirety.

TECHNICAL FIELD

A radiation-emitting component is specified. In particular, the radiation-emitting component is suitable for generating single-colored light.

SUMMARY OF THE INVENTION

Embodiments of the invention provide a radiation-emitting component having an increased luminance. Furthermore, embodiments of the invention provide a radiation-emitting component which has an improved efficiency for generating single-colored light and can be produced cost-effectively. Furthermore, in other embodiments the radiation-emitting component could generate mixed colors.

In accordance with at least one embodiment of the radiation-emitting component, the radiation-emitting component comprises at least one radiation-emitting semiconductor chip.

By way of example, the radiation-emitting component can be a light-emitting diode, LED for short. That is to say that the radiation-emitting component emits incoherent radiation during operation.

The radiation-emitting semiconductor chip can be based on a nitride compound semiconductor material, in particular. In the present context, "based on nitride compound semiconductor material" means that a semiconductor layer sequence of the radiation-emitting semiconductor chip or at least one part thereof, particularly preferably at least one active zone and/or a growth substrate wafer, comprises or consists of a nitride compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise, for example, one or a plurality of dopants and additional constituents. For the sake of simplicity, however, the above formula includes only the essential constituents of the crystal lattice (Al, Ga, In, N), even if these can be replaced and/or supplemented in part by small amounts of further substances.

In particular, the radiation-emitting semiconductor chip generates blue light or UV radiation during operation.

In accordance with at least one embodiment of the radiation-emitting component, the radiation-emitting component comprises at least one radiation-emitting semiconductor chip, wherein each of the radiation-emitting semiconductor chips has a radiation exit area comprising at least one side face and a main face of the radiation-emitting semiconductor chip. In the present context, "main face" is understood to mean an outer face having the largest lateral extent. In other words, top face and bottom face of a rectangular radiation-emitting semiconductor chip can be the respective main faces of the radiation-emitting semiconductor chip. In particular, the main face of each radiation-emitting semiconductor chip in a lateral direction can be embodied such that it is larger by a multiple than the side face of each radiation-emitting semiconductor chip in the vertical direction. In this case, the vertical direction runs in particular parallel to a growth direction of an epitaxially grown semiconductor layer sequence of the radiation-emitting semiconductor chip. The lateral direction runs transversely with respect to the growth direction and runs, for example, in the plane of a main face of the radiation-emitting semiconductor chip.

The side faces of the chip can connect the top face to the bottom face. In this case, a side face runs in particular transversely, preferably perpendicularly with respect to the main face.

The radiation-emitting component can comprise one or a plurality of radiation-emitting semiconductor chips. In this case, all the semiconductor chips of the radiation-emitting component can be structurally identical.

In accordance with at least one embodiment of the radiation-emitting component, the radiation-emitting component comprises at least one conversion element, wherein each of the conversion elements has a radiation exit area comprising at least one side face and a main face of the conversion element. In particular, the main face of each conversion element in a lateral direction is larger by a multiple than the side face of each conversion element in the vertical direction. The above-described properties with regard to the features of a main face and a side face with respect to each of the radiation-emitting semiconductor chips are analogously applicable to each conversion element described here.

The radiation-emitting component can comprise one or a plurality of conversion elements. In this case, all the conversion elements of the radiation-emitting component can be structurally identical.

In accordance with at least one embodiment of the radiation-emitting component, the conversion element comprises at least one conversion material or consists of a conversion material. By way of example, the conversion material is embedded in a matrix material such as silicone. The conversion material can in particular comprise a YAG- or LuAG-based phosphor or consist of a ceramic phosphor. By way of example, the conversion material can be a $YAG:Ce^{3+}$ or an $LuAG:Ce^{3+}$, wherein these can comprise rare earths and in particular Gd, Ga or Sc. Furthermore, the conversion material can comprise at least one of the following conversion materials or consist of one of these conversion materials: $SrSiON:Eu^{2+}$, $(Sr,Ba,Ca)_2Si_5N_8:Eu^{2+}$, $(Sr,Ca)AlSiN_3:Eu^{2+}$, $CaSiAlON:Eu^{2+}$.

In accordance with at least one embodiment of the radiation-emitting component, the radiation-emitting component comprises a first reflection element disposed downstream of the at least one conversion element and the at least one radiation-emitting semiconductor chip. In the present context "disposed downstream" is understood to mean that electromagnetic radiation of the semiconductor chip generated during operation can impinge on the first reflection element. For example, it is possible that the electromagnetic radiation of the radiation-emitting component generated during operation can pass toward the outside exclusively through the first reflection element. In particular, the first reflection element can be disposed downstream in such a way that the electromagnetic radiation is firstly guided to the first reflection element via an optical waveguide or a further reflection element before the radiation impinges on the first reflection element. By way of example, the first reflection element can cover and outwardly close off and/or outwardly delimit the at least one semiconductor chip in the manner of a cover. The first reflection element can be embodied in a wavelength-selective fashion. That is to say that the first reflection element reflects electromagnetic radiation in a first spectral range, whereas electromagnetic radiation in a second spectral range is transmitted.

In accordance with at least one embodiment of the radiation-emitting component, the ratio of the sum of the radiation exit areas of all the radiation-emitting semiconductor chips to the sum of the radiation exit areas of all the conversion elements is greater than 1. That is to say that, for example, the addition of all the areas of main faces and side faces of each radiation-emitting semiconductor chip yields a value which, divided by the sum of all the areas of main faces and side faces of each conversion element, yields a value of greater than 1. Overall, therefore, unconverted primary radiation emerges from the semiconductor chips through a larger total area than the area through which converted secondary radiation emerges from the at least one conversion element. In other words, the luminance of the conversion elements is in comparison higher than in the case of the semiconductor chips. Consequently, the converted radiation or the converted beam leaving the at least one conversion element has a lower etendue than the radiation of the at least one radiation-emitting semiconductor chip generated during operation. Preferably, the sum of the radiation exit areas of all the radiation-emitting semiconductor chips is greater by a multiple than the sum of the radiation exit areas of all the conversion elements.

In accordance with at least one embodiment of the radiation-emitting component, the at least one conversion element adjoins the at least one radiation-emitting semiconductor chip at least in places. In particular, the at least one conversion element can be in direct contact by one of its main faces at one of the main faces of the at least one radiation-emitting semiconductor chip. That is to say that in particular an interface can form between the conversion element and the radiation-emitting semiconductor chip. However, a possible mechanical connection between the radiation exit area of the at least one radiation-emitting semiconductor chip and of the at least one conversion element can also be formed by a connection element. In this case, the vertical extent, that is to say the thickness of the connection means is embodied in particular in such a way that the vertical extent of the connection means is less than the vertical extent of the at least one converter element and/or the at least one radiation-emitting semiconductor chip. Such a connection element can be, for example, a radiation-transmissive, pellucid or transparent plastic. In particular, silicones and epoxides are appropriate as connection means.

In accordance with at least one embodiment of the radiation-emitting component, the at least one radiation-emitting semiconductor chip generates primary radiation during operation. In the present context "primary radiation" is understood to mean that electromagnetic radiation which is emitted with at least one first wavelength in particular during the operation of the radiation-emitting semiconductor chip.

The generation of the primary radiation of the radiation-emitting semiconductor chip preferably takes place in at least one active zone comprising at least one quantum well structure and/or at least one pn junction. The primary radiation is generated in particular in the respective active zone of each radiation-emitting semiconductor chip.

In accordance with at least one embodiment of the radiation-emitting component, the conversion element converts the primary radiation into secondary radiation. Preferably, the at least one conversion element converts a large part of the primary radiation into secondary radiation. In the present context, "large part" is understood to mean that at least 50%, preferably at least 75%, particularly preferably 90%, of the primary radiation is absorbed by the at least one conversion element and secondary radiation is correspondingly emitted by the at least one conversion element. That is to say that particularly preferably at least 90% of the primary radiation being emitted by the at least one semiconductor chip is absorbed in the at least one conversion element and emitted as secondary radiation.

The primary radiation emitted by the radiation-emitting semiconductor chip is, in particular, not a radiation from the spectral range of the secondary radiation. In the present context, the secondary radiation particularly preferably comprises a less energetic radiation than the primary radiation. Consequently, the spectral range of the secondary radiation is dissimilar to the spectral range of the primary radiation. Furthermore, the spectral range of the secondary radiation can overlap the spectral range of the primary radiation at least in places.

In accordance with at least one embodiment of the radiation-emitting component, the primary radiation and the secondary radiation leave the radiation-emitting component exclusively through the first reflection element, wherein the first reflection element reflects a large part of the primary radiation. As already described above, the first reflection element is disposed downstream of the at least one conversion element and the at least one radiation-emitting semiconductor chip. The first reflection element can be embodied in a wavelength-selective fashion, in particular. A large part of the secondary radiation converted by the conversion element is transmitted, wherein a large part of the primary radiation is reflected at the first reflection element. By way of example, the first, wavelength-selective reflection element is present as an interference filter or dielectric mirror.

The first reflection element reflects a large part of the primary radiation in the direction of the at least one conversion element and/or of the at least one radiation-emitting semiconductor chip. In the present context "large part" is understood to mean that at least 50%, preferably at least 75%, particularly preferably 90%, of the primary radiation is reflected by the first reflection element. That is to say that particularly preferably at least 90%, in particular 99%, of the primary radiation remains in the radiation-emitting component and the primary radiation, if appropriate after the reflection at the first reflection element, impinges on at least one of the conversion elements and can be converted into secondary radiation.

In accordance with at least one embodiment of the radiation-emitting component, the radiation-emitting component comprises at least one radiation-emitting semiconductor chip, wherein each of the radiation-emitting semiconductor chips has a radiation exit area comprising at least one side face and a main face of the radiation-emitting semiconductor chip, at least one conversion element, wherein each of the conversion elements has a radiation exit area comprising at least one side face and a main face of the conversion element, and a first reflection element disposed downstream of the at least one conversion element and the at least one radiation-emitting semiconductor chip, wherein the ratio of the sum of the radiation exit areas of all the radiation-emitting semiconductor chips to the sum of the radiation exit areas of all the conversion elements is greater than 1. The at least one conversion element adjoins the at least one radiation-emitting semiconductor chip at least in places, the at least one radiation-emitting semiconductor chip generates primary radiation during operation, the conversion element converts the primary radiation into secondary radiation, the primary radiation and the secondary radiation leave the radiation-emitting component exclusively through the first reflection element, wherein the first reflection element reflects a large part of the primary radiation.

The radiation-emitting components described here are based on the insight that the limited luminance of a light source in etendue-limited devices and systems—for example, projection systems—leads to a likewise limited maximum achievable total brightness of the system. In order to obtain an increased luminance, the radiation-emitting component described here makes use of the concept, inter alia, of making the radiation exit areas of at least one radiation-emitting semiconductor chip large enough that the conversion element adjoining the radiation-emitting semiconductor chip has a radiation exit area that is significantly smaller in comparison. The ratio of the radiation exit area of the radiation-emitting semiconductor chip to the radiation exit area of the conversion element thus yields a value of greater than 1. Furthermore, in particular, a first reflection element is used which can be embodied in a wavelength-selective fashion, in particular, and secondary radiation substantially emerges from the radiation-emitting component, wherein primary radiation can remain in the radiation-emitting component in particular according to the principle of multiple reflection, such that the primary radiation can be converted by the conversion element or absorbed by the conversion element at a later point in time. A maximization of the luminous efficiency can be achieved as a result.

In accordance with at least one embodiment of the radiation-emitting component, part of the primary radiation from at least one of the radiation-emitting semiconductor chips impinges on the first reflection element directly and/or without being converted, and part directly enters the at least one adjoining conversion element. In other words, at least in places, radiation exit areas of the at least one radiation-emitting semiconductor chip are free of one of the conversion elements. In these regions, the conversion element does not adjoin the radiation exit area of the radiation-emitting semiconductor chip and the primary radiation generated during operation impinges on the first reflection element without being impeded. If the at least one conversion element adjoins the at least one radiation-emitting semiconductor chip, then in particular a conversion of the primary radiation into secondary radiation can take place.

In accordance with at least one embodiment of the radiation-emitting component, the primary radiation reflected at the reflection element at least partly impinges on the conversion element. The reflected primary radiation remains at least partly in the component, as already described above. Since the radiation exit areas of the at least one radiation-emitting semiconductor chip is embodied in a manner larger than the radiation exit areas of the at least one conversion element, the primary radiation can impinge in particular on a conversion element or on a semiconductor chip. The primary radiation that impinges on the conversion element and is reflected at the first reflection element can be converted into secondary radiation, wherein the primary radiation impinging on the at least one semiconductor chip can remain in the component without being changed with regard to its wavelength and can be reflected, for example, by a further reflection element.

In accordance with at least one embodiment of the radiation-emitting component, the number of radiation-emitting semiconductor chips is greater than the number of conversion elements. As already described above, the radiation-emitting component can comprise a multiplicity of radiation-emitting semiconductor chips and a multiplicity of conversion elements, wherein the ratio of the sum of the radiation exit areas of all the radiation-emitting semiconductor chips to the sum of the radiation exit areas of all the conversion elements yields a value of greater than 1.

In accordance with at least one embodiment of the radiation-emitting component, the radiation-emitting semiconductor chips are arranged in rows and columns, wherein the radiation-emitting semiconductor chips are arranged at a distance from one another. In this case, the at least one conversion element can be arranged in a manner adjoining at least one, in particular a plurality, of the radiation-emitting semiconductor chips at least in places.

In accordance with at least one embodiment of the radiation-emitting component, the latter comprises at least two radiation-emitting semiconductor chips and a single conversion element. In this case, the at least two radiation-emitting semiconductor chips can be structurally identical, for example, and emit primary radiation of the same color, wherein the sum of the radiation exit areas of the at least two radiation-emitting semiconductor chips as a ratio with respect to the sum of the radiation exit area of the single conversion element yields a value of greater than 1.

In accordance with at least one embodiment of the radiation-emitting component, the latter comprises a carrier having a first main face, wherein the first main face comprises a second reflection element, wherein the at least one radiation-emitting semiconductor chip is arranged on the first main face of the carrier, and the second reflection element is designed for reflecting primary radiation and secondary radiation. The carrier can comprise an electrically insulating material and/or an electrically conductive material. The carrier can be embodied in particular in the manner of a leadframe that is potted in a potting compound. Furthermore, the carrier can be a printed circuit board, for example, in the form of a metal-core circuit board. The carrier is embodied in a self-supporting fashion. "First main face" is understood to mean the outer face having the largest lateral extent of the carrier which faces the semiconductor chips.

A second reflection element is formed on the first main face, wherein the above-described arrangement comprising at least one conversion element and at least one radiation-emitting semiconductor chip can be arranged on the first main face of the carrier with the second reflection element. As already described above, the primary radiation and the secondary radiation can leave the radiation-emitting component exclusively through the first reflection element, wherein the first reflection element reflects a large part of the primary radiation. The primary radiation reflected in particular by the first reflection element and the secondary radiation can be reflected again by the second reflection element, in particular. In other words, a multiple reflection within the radiation-emitting component is made possible in particular by the embodiment of the second reflection element. As a result, in particular, the proportion of the primary radiation impinging on the at least one conversion element is increased, which can result in particular in an increase in the luminance of the at least one conversion element.

In accordance with at least one embodiment of the radiation-emitting component, the carrier comprises sidewall faces which adjoin the first main face of the carrier at least in places wherein the second reflection element is embodied on the sidewall faces of the carrier, and the sidewall faces encloses the at least one radiation-emitting semiconductor chip in a lateral direction. In other words, the at least one radiation-emitting semiconductor chip and the at least one conversion element are arranged in a housing, wherein, for example, the bottom face and the sidewall face of the housing can be formed with the second reflection element. The second reflection element can be sprayed, vapor-deposited and/or grown on the corresponding faces. In this case, the first reflection element can be embodied as a cover face of the housing and terminate flush in particular with the sidewall faces of the housing. In a further embodiment, the first reflection element can be embodied in a lens-shaped fashion and/or in the manner of a layer and can be arranged in particular at the side faces of the housing.

In accordance with at least one embodiment of the radiation-emitting component, the radiation-emitting semiconductor chip emits primary radiation, from the spectral range of blue light, during operation. For example, the peak wavelengths of the primary radiation lie in the range of 400 to 490 nm.

In accordance with at least one embodiment of the radiation-emitting component, the secondary radiation is in the spectral range of visible light and has a different color than the primary radiation. The primary radiation is particularly preferably converted by the conversion element into less energetic secondary radiation which has at least one wavelength greater than 490 nm and is in the visible range. In particular, the secondary radiation can be colored light, in particular green, yellow, orange or red light.

In this case, the primary radiation is particularly preferably converted into single-colored secondary radiation, in particular single-colored light. The single-colored secondary radiation is particularly well suited to use in projection devices.

In accordance with at least one embodiment of the radiation-emitting component, the at least one conversion element is arranged at a main face of the at least one radiation-emitting semiconductor chip and adjoins the main face of the at least one radiation-emitting semiconductor chip, wherein at least the side face of the at least one radiation-emitting semiconductor chip is free of the at least one conversion element. The at least one conversion element completely covers the at least one radiation-emitting semiconductor chip. The adjoining at least one conversion element terminates flush with its side face of the at least one radiation-emitting semiconductor chip in a lateral direction. The primary radiation emerging at the main face of the at least one radiation-emitting semiconductor chip thus passes directly into the at least one conversion element, where a large part of the primary radiation can be converted to the secondary radiation. In this embodiment of the radiation-emitting component, no primary radiation impinges directly on the first reflection element through the main face of the at least one radiation-emitting semiconductor chip. Primary radiation can emerge through the side faces of the radiation exit area of the at least one radiation-emitting semiconductor chip without any influence of the at least one adjoining conversion element. That is to say that at least partly the primary radiation emitted by the at least one semiconductor chip through the side faces thereof initially does not pass, traverse and/or penetrate through the conversion element.

Furthermore, an optical projection device is specified comprising a light source, which comprises at least one radiation-emitting component described here, and an imaging element, where the light source is provided for illuminating the imaging element. The light source can have in particular three radiation-emitting components which respectively generate green, red and/or blue light and radiate into an X-cube. The light source can generate white mixed light, in particular, which can be used for illuminating the imaging element. The image generated in the imaging element can furthermore be imaged or projected on a projection area.

BRIEF DESCRIPTION OF THE DRAWINGS

The radiation-emitting component described here is explained below on the basis of exemplary embodiments with associated figures.

The schematic sectional illustrations in FIGS. 1 to 3 show exemplary embodiments of a radiation-emitting component described here.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
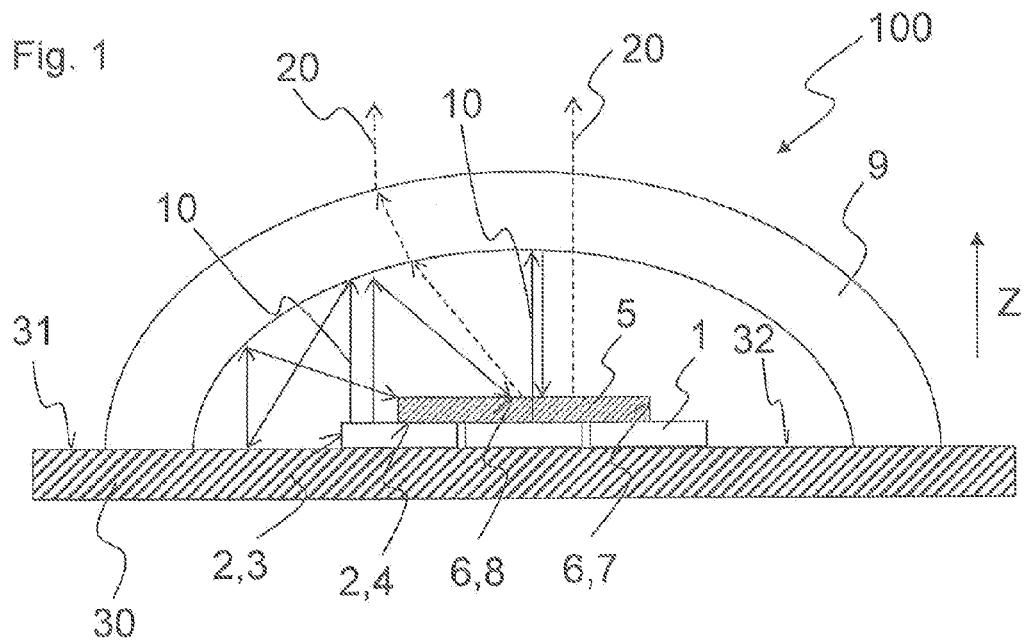

FIG. 1 shows a schematic sectional view of a radiation-emitting component 100.

The radiation-emitting component 100 comprises a plurality of radiation-emitting semiconductor chips 1, a conversion element 5, a first reflection element 9 and a carrier 30 having a first main face 31, wherein the first main face 31 comprises a second reflection element 32. The radiation-emitting semiconductor chips 1 are spaced apart from one another and form a row and/or a matrix characterized by three rows and three columns.

The radiation-emitting semiconductor chips 1 adjoin the first main face 31 of the carrier 30 with their main faces 4, wherein the conversion element 5 is in direct contact with the main faces 4 of the radiation-emitting semiconductor chips 1 by its main face 8 in the emission direction Z. The conversion element 5 is arranged centrally on the radiation-emitting semiconductor chips 1. The first reflection element 9 is disposed downstream of the radiation-emitting semiconductor chips 1 and the conversion element 5 in such a way that the primary radiation 10 and secondary radiation 20 generated during operation leave the radiation-emitting component 100 exclusively through the first reflection element 9, wherein the first reflection element 9 reflects a large part of the primary radiation. FIG. 1 shows that the primary radiation 10 that is converted into secondary radiation 20 by the conversion element 5 can pass through the first reflection element 9, whereas a large part of the unconverted primary radiation 10 is reflected at the first reflection element 9. The primary radiation 10 which is emitted directly by the at least one radiation-emitting semiconductor chip 1 and impinges on the first reflection element can be reflected in particular in the direction of the converter element 5, wherein a conversion of the primary radiation 10 into secondary radiation 20 can take place. The primary radiation 10 reflected by the first reflection element 9 can furthermore impinge on the second reflection element 32, wherein a reflection or multiple reflection can again take place, such that at least partly the reflected primary radiation 10 can be converted or absorbed by the conversion element 5.

Figure 2:
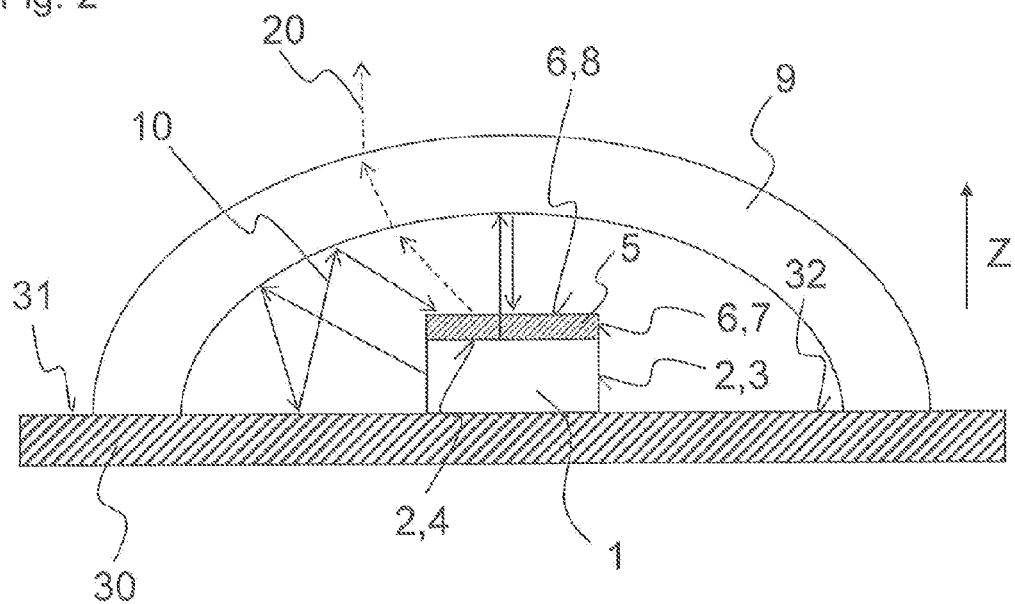

FIG. 2 shows a further schematic sectional illustration of the radiation-emitting component 100. In contrast to FIG. 1, only one radiation-emitting semiconductor chip 1 is shown, wherein the conversion element 5 is in direct contact with the main face 4 of the radiation-emitting semiconductor chip 1 that faces the first reflection element 9. In FIG. 2, the sum of all the radiation exit areas of the one radiation-emitting semiconductor chip 1 is significantly greater than the sum of all the radiation exit areas of the one conversion element 5, such that the ratio of the sum of the radiation exit areas of the radiation-emitting semiconductor chip to the sum of the radiation exit area of the conversion element yields a value of greater than 1. Furthermore, the conversion element 5 is arranged at the main face 4 in such a way that the side faces 2 of the radiation-emitting semiconductor chip 1 is free of the conversion element 5.

Figure 3:
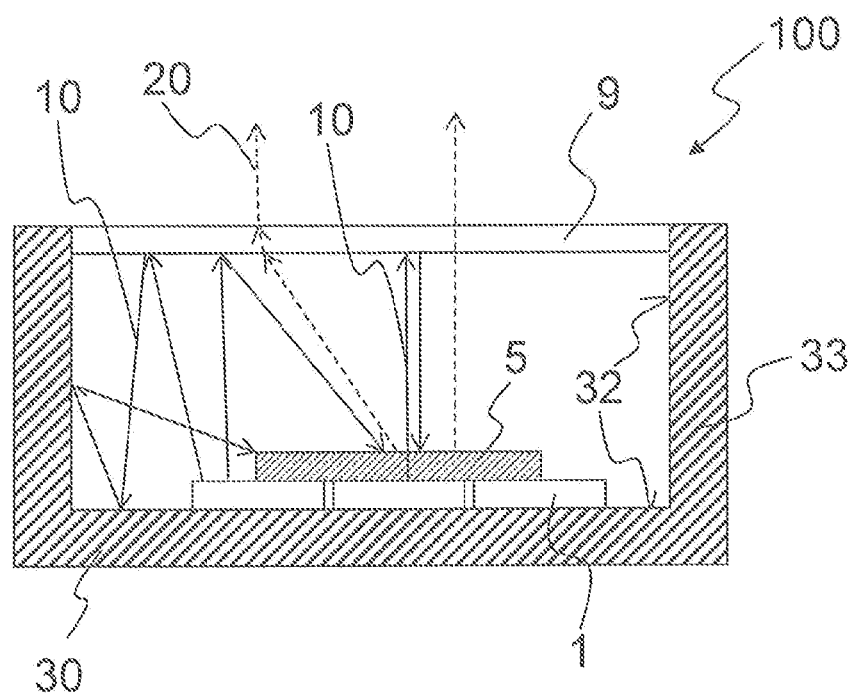

FIG. 3 shows a schematic sectional illustration of the radiation-emitting component 100, wherein the arrangement described in FIG. 1 with regard to the radiation-emitting semiconductor chips 1 and to the converter element 5 is situated in a cutout of a housing. The housing comprises sidewall faces 33 and the carrier 30, wherein the carrier 30 has the first main face 31. Furthermore, the second reflection element 32 is formed in each case at areas of the sidewall faces 33 and of the first main face 31 of the carrier 30 that enclose the at least one semiconductor chip 1. The first reflection element 9 terminates flush with the sidewall faces 33 of the housing. On the basis of the first and second reflection elements 9, 32, multiple reflection of the primary radiation 10 and secondary radiation 20 can occur within the radiation-emitting component 100, wherein a large part of the secondary radiation is transmitted and/or allowed to pass by the first reflection element.

Figure 4:
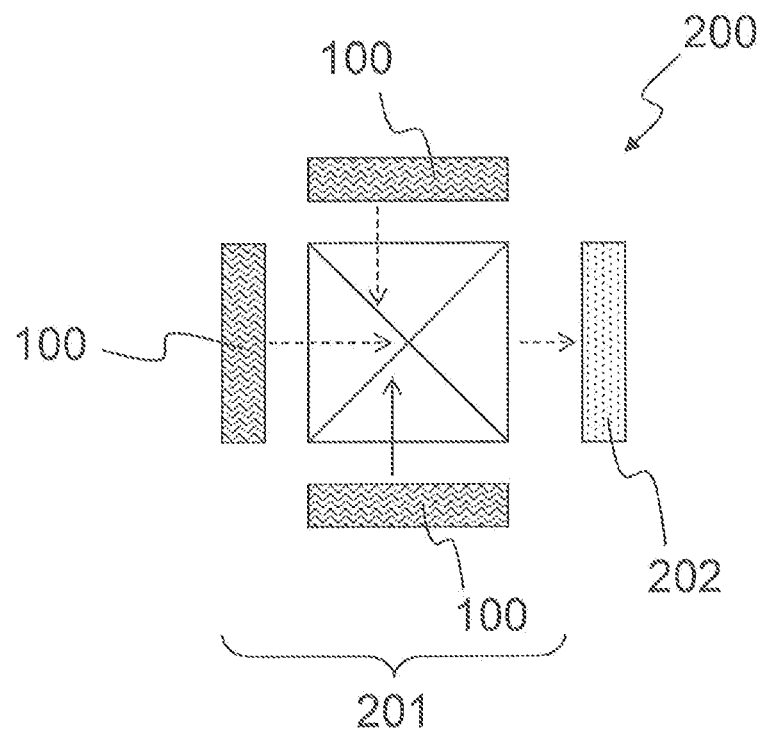
FIG. 4 shows a schematic illustration of an optical projection device.

FIG. 4 shows a schematic illustration of an optical projection device comprising a light source 201, which comprises three radiation-emitting components 100, and an imaging element 202. The three radiation-emitting components 100, which can be embodied in particular according to one of the exemplary embodiments from FIG. 1, 2 or 3, in each case emit secondary radiation having a different wavelength, which can comprise green, red and blue spectral ranges, for example. The light source 201 is able to generate white mixed radiation by means of an X-cube. The mixed radiation generated by the light source 201 can be used for illuminating the imaging element 202.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting component comprising:
   at least one radiation-emitting semiconductor chip, wherein each of the radiation-emitting semiconductor chips has a radiation exit area comprising at least one side face and a main face of the radiation-emitting semiconductor chip;
   at least one conversion element, wherein each of the conversion elements has a radiation exit area comprising at least one side face and a main face of the conversion element; and
   a first reflection element disposed downstream of the at least one conversion element and the at least one radiation-emitting semiconductor chip,
   wherein a ratio of a sum of the radiation exit areas of all the radiation-emitting semiconductor chips to a sum of the radiation exit areas of all the conversion elements is greater than 1,
   wherein the at least one conversion element adjoins the at least one radiation-emitting semiconductor chip at least in places,
   wherein the at least one radiation-emitting semiconductor chip is configured to generate primary radiation,
   wherein the conversion element is configured to convert the primary radiation into secondary radiation,
   wherein the primary radiation and the secondary radiation leave the radiation-emitting component exclusively through the first reflection element, and
   wherein the first reflection element reflects at least 50% of the primary radiation.

2. The radiation-emitting component according to claim 1, wherein part of the primary radiation from at least one of the radiation-emitting semiconductor chips irradiates directly on the first reflection element and part directly enters the at least one adjoining conversion element.

3. The radiation-emitting component according to claim 1, wherein the primary radiation reflected at the first reflection element at least partly irradiates on the conversion element.

4. The radiation-emitting component according to claim 1, wherein a number of radiation-emitting semiconductor chips is greater than a number of conversion elements.

5. The radiation-emitting component according to claim 1, wherein the radiation-emitting component comprises at least two radiation-emitting semiconductor chips and a single conversion element.

6. The radiation-emitting component according to claim 1, further comprising a carrier having a first main face, wherein the first main face comprises a second reflection element, wherein the at least one radiation-emitting semiconductor chip is arranged on the first main face of the carrier, and wherein the second reflection element is configured to reflect the primary radiation and the secondary radiation.

7. The radiation-emitting component according to claim 6, wherein the carrier comprises sidewall faces which adjoin the first main face of the carrier at least in places, wherein the second reflection element is embodied on the sidewall faces of the carrier, and wherein the sidewall faces encloses the at least one radiation-emitting semiconductor chip in a lateral direction.

8. The radiation-emitting component according to claim 1, wherein the primary radiation is in a spectral range of blue light.

9. The radiation-emitting component according to claim 1, wherein the secondary radiation is in a spectral range of visible light and has a different color than the primary radiation.

10. The radiation-emitting component according to claim 1, wherein the at least one conversion element is arranged at a main face of the at least one radiation-emitting semiconductor chip and adjoins the main face of the at least one radiation-emitting semiconductor chip, and wherein at least the side faces of the at least one radiation-emitting semiconductor chip are free of the at least one conversion element.

11. An optical projection device comprising:
   a light source, which comprises at least one radiation-emitting component according to claim 1; and
   an imaging element, where the light source is provided for illuminating the imaging element.

* * * * *